United States Patent [19]

Sugai

[11] Patent Number: 5,087,833
[45] Date of Patent: Feb. 11, 1992

[54] SIGNAL SWITCHING CIRCUIT AND SIGNAL CHANGE-OVER CIRCUIT USING THE SAME

[75] Inventor: Masao Sugai, Gyoda, Japan

[73] Assignee: Advantest Corporation, Tokyo, Japan

[21] Appl. No.: 505,992

[22] Filed: Apr. 9, 1999

[51] Int. Cl.$^5$ .................. H03K 19/086; H03K 3/313
[52] U.S. Cl. ............................ 307/443; 307/455; 307/242; 307/259; 307/317.1; 307/551
[58] Field of Search ............ 307/443, 455, 242, 259, 307/353, 317.1, 540, 549, 551, 555

[56] References Cited

U.S. PATENT DOCUMENTS

| | | | |
|---|---|---|---|
| 3,531,658 | 9/1970 | Chong | 307/242 |
| 3,617,771 | 1/1971 | Lee | 307/242 |
| 3,671,783 | 6/1972 | Hampel et al. | 307/353 |
| 4,950,918 | 8/1990 | O'Breartuin et al. | 307/242 |

Primary Examiner—Stanley D. Miller
Assistant Examiner—Margaret Rose Wambach
Attorney, Agent, or Firm—Staas & Halsey

[57] ABSTRACT

A transmission line is connected in series to the emitter of an output transistor of an ECL circuit which outputs a logical signal, and a pair of series-connected switching diodes is connected to the output end of the transmission line. A parallel switching diode is provided which has its anode connected to the common connection point of the pair of series-connected switching diodes and has its cathode connected to a common potential point. A current pull-in circuit responsive to a control signal and a bias supply circuit are connected to the common connection point. The current pull-in circuit is turned ON to pull in current from the pair of series-connected switching diodes, thereby turning them ON. At this time, the parallel switching diode is turned OFF and the logical signal from the ECL circuit passes through the pair of series-connected switching diodes and is then output. Conversely, when the current pull-in circuit is turned OFF, the pair of series-connected switching diodes is reversely biased, and consequently, no current flows through the emitter of the output transistor of the ECL circuit. As a result of this, the logical signal is not provided on the transmission line.

15 Claims, 8 Drawing Sheets

SIGNAL SWITCHING CIRCUIT AND SIGNAL CHANGE-OVER CIRCUIT USING THE SAME

BACKGROUND OF THE INVENTION

The present invention relates to a signal switching circuit usable in a system including various logical circuits and a signal change-over circuit using such a signal switching circuit or circuits.

FIG. 1 shows a typical signal change-over circuit heretofore employed. In this circuit logical signals $S_1$, $S_2, \ldots, S_n$ output from a plurality of logical circuits $10_1$, $10_2, \ldots, 10_n$ are provided via transmission lines $12_1, 12_2, \ldots, 12_n$ to logic gate circuits $20_1, 20_2, \ldots, 20_n$ at one input thereof in a selector circuit 200. The logic gate circuits $20_1$ through $20_n$ are supplied at the other inputs with control signals $C_1$ through $C_n$ for enabling and disabling them. A desired one of the logic gate circuits $20_1$ to $20_n$ is enabled by one of the control signals $C_1$ to $C_n$ to select a desired one of the logical signals $S_1$ to $S_n$, which is provided to an output terminal 40 via an OR gate 30. Each signal path, which comprises, for example, the logical circuit $10_1$, the transmission line $12_1$ and the logic gate circuit $20_1$, constitutes a signal switching circuit $100_1$.

Such a signal change-over circuit is also referred to as a multiplexer and can be used, for example, to output a selected one of clock signals of different frequencies from a plurality of clock signal sources.

The logic gate circuits $20_1$ to $20_n$ which open and close the gate for the logical signals, are not limited specifically to the NAND gates shown in FIG. 1 but may also be various other gate circuits. An ordinary gate circuit is able to control passage of a signal of a frequency between 50 to 70 MHz or so. However, in the case of handling a signal of a frequency higher than 100 MHz, for example, even if the gate circuit is closed, the input signal leaks to the output side of the gate circuit and the leakage level is so high as not to be negligible. That is, in the conventional signal change-over circuit depicted in FIG. 1, for instance, even if the NAND gate circuit $20_1$ is held disabled by the control signal $C_1$, the logical signal $S_1$ from the transmission line $12_1$ leaks to the output side of the NAND gate $20_1$ and interferes with other selected logical signals in the OR gate 30.

Further, in the signal change-over circuit shown in FIG. 1 the logical signals $S_1$ to $S_n$ from the logical circuits $10_1$ to $10_n$ are always present on the transmission lines $12_1$ to $12_n$ regardless of the ON/OFF state of the gate circuits $20_1$ to $20_n$. This poses another problem as the logical signals $S_1$ to $S_n$ on the lines $12_1$ to $12_n$ interfere with one another as their frequencies rise.

SUMMARY OF THE INVENTION

It is therefore an object of the present invention to provide a signal switching circuit which is free from the leakage of signals even if their frequencies are high.

Another object of the present invention is to provide a signal change-over circuit which employs a plurality of such signal switching circuits and is free from interference of signals between a plurality of transmission lines.

According to an aspect of the present invention, the signal switching circuit has an arrangement in which a transmission line is connected in series to the emitter of an output transistor of an emitter-coupled logical circuit which provides a logical signal, and switching diode means is connected in series to the output end of the transmission line. The switching diode means is turned ON and OFF by bias control means which responds to a control signal. In the ON state the switching diode means permits the passage therethrough of the logical signal from the transmission line but in the OFF state it cuts off current, cutting off the emitter current of the output transistor of the emitter-coupled logical circuit. Thus, since no logical signal is provided on the transmission line from the emitter-coupled logical circuit when the switching diode means is in the OFF state, there is no possibility of the leakage of the logical signal through the switching diode means.

Where a signal change-over circuit is formed by a plurality of such signal switching circuits, emitter currents of output transistors of emitter-coupled logical circuits cannot flow into the transmission lines connected to the switching diode means held in the OFF state by the control signals, and consequently no logical signals are provided on the transmission lines. Thus, no interference of signals between the transmission lines will occur.

According to another aspect of the present invention, the signal switching circuit is made up of a transmission line connected at one end to the emitter output of an emitter-coupled logical circuit which outputs a logical signal, gate means connected at one input to the other end of the transmission line and supplied at the other input with a control signal for enabling and disabling it, and level holding means which is supplied with the control signal and, when the control signal is in the logical state of disabling the gate means, produces a high-level output to thereby hold the one input of the gate at the high level regardless of the logical signal.

With such a signal switching circuit, when the gate means is disabled by the control signal, the level holding means which is supplied with the same control means yields a high-level output, by which the input of the gate means connected to the transmission line is held at the high level. This is essentially equivalent to the state in which no logical signal is provided from the emitter output of the emitter-coupled logical circuit, and hence no logical signal will leak through the gate means being disabled.

Where a signal change-over circuit is formed using a plurality of such signal switching circuits, transmission lines connected to the inputs of the gate means which are being disabled by control signals are all held at the high level, and consequently no logical signals are present on the transmission lines. Thus, no signal interference will occur between the transmission lines.

DESCRIPTION OF THE PREFERRED EMBODIMENTS

Figure 1:
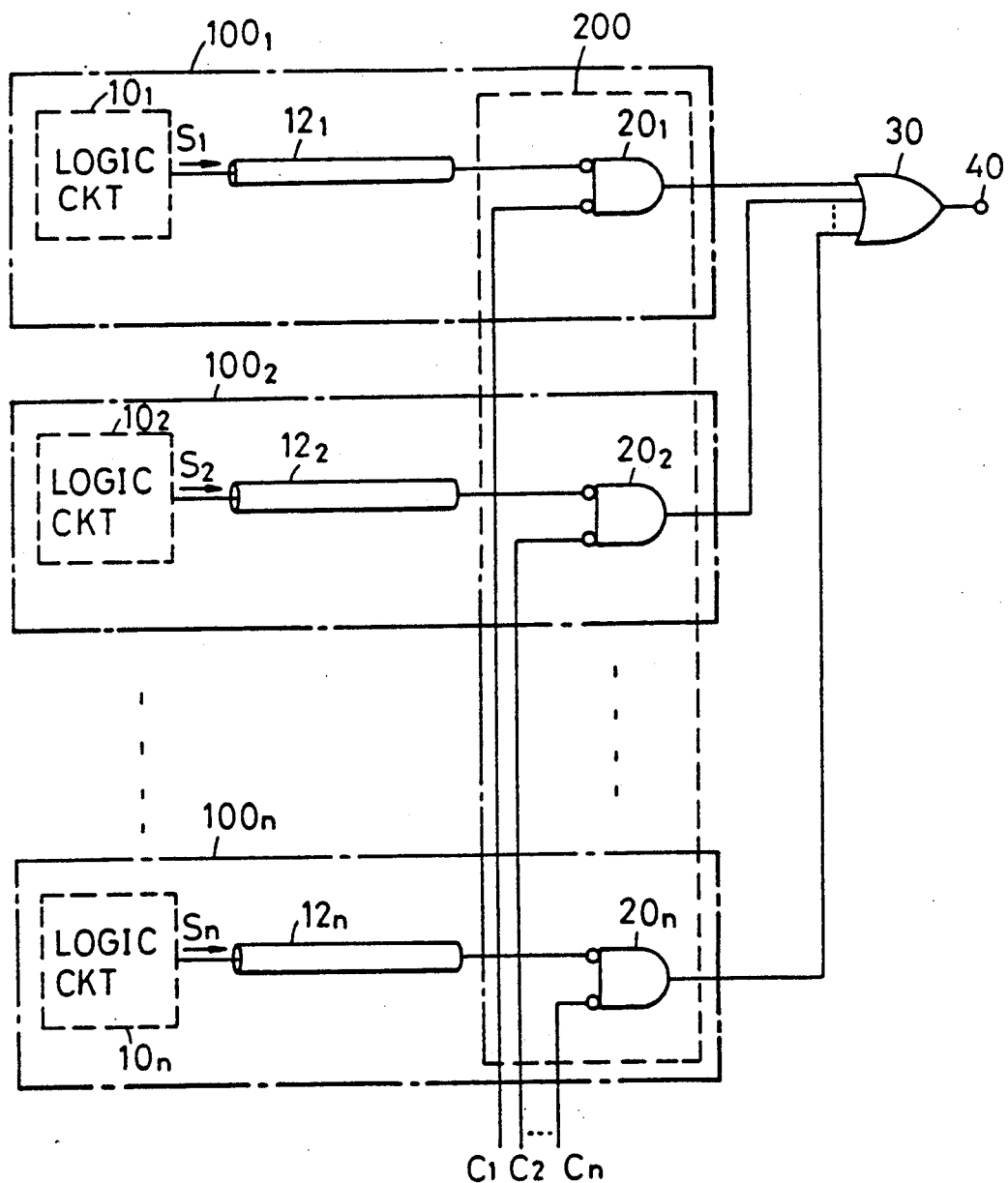
FIG. 1 is a circuit diagram of a typical signal change-over circuit heretofore employed.
Figure 2:
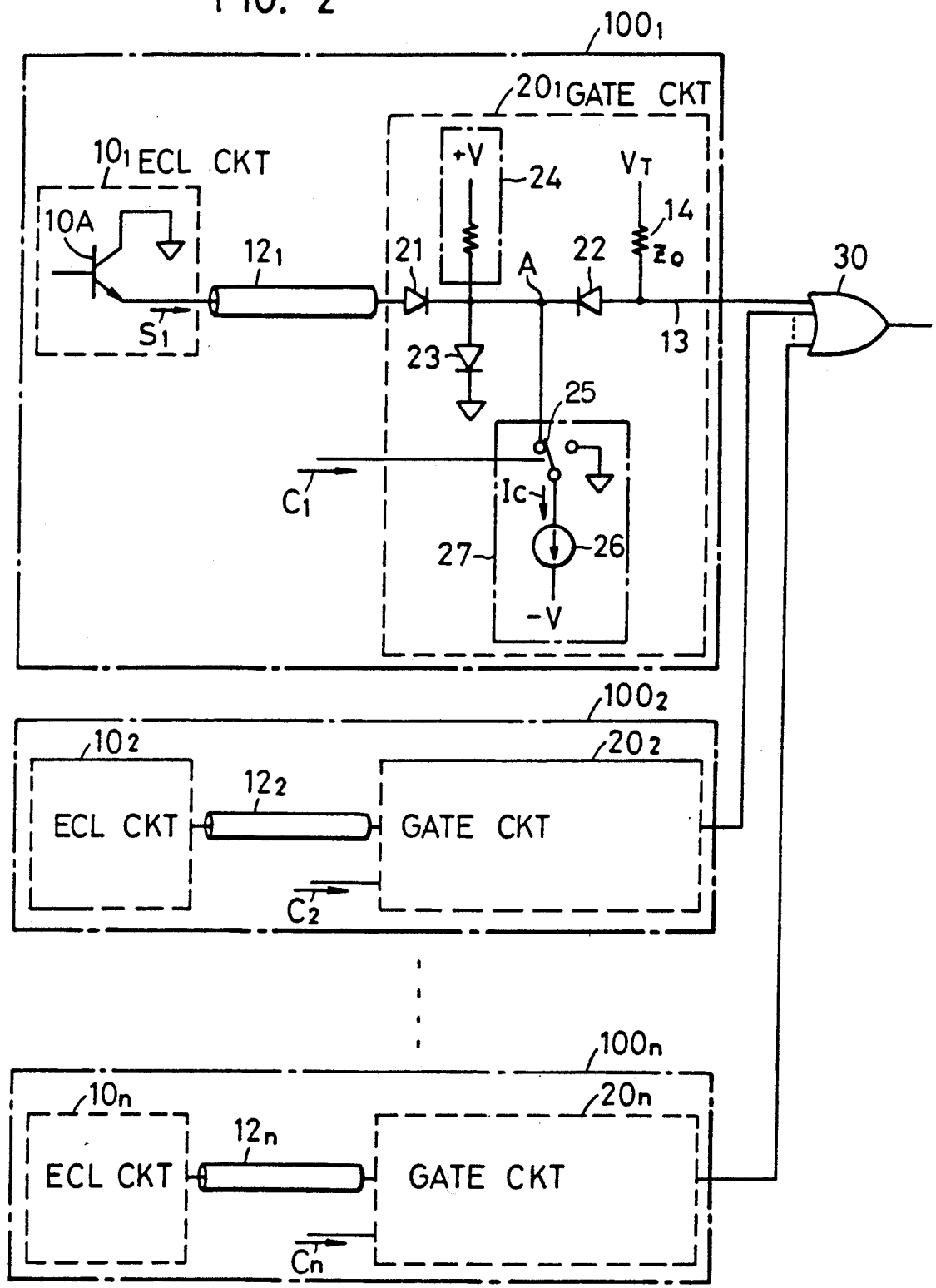
FIG. 2 is a block diagram of a signal change-over circuit formed by a plurality of signal switching circuits produced according to an embodiment of the present invention.

FIG. 2 illustrates a signal change-over circuit (a multiplexer) formed by a plurality of signal switching circuits produced according to an embodiment of the present invention. The signal switching circuit $100_1$ includes an emitter-coupled logical circuit (hereinafter referred to as an ECL circuit) $10_1$, a transmission line $12_1$ and a gate circuit $20_1$. In addition to the signal switching circuit $100_1$ a plurality of signal switching circuits $100_2$ through $100_n$ identical in construction therewith are provided, and the outputs of these signal switching circuits $100_1$ through $100_n$ are connected to an OR gate 30 serving as a coupling means, thus constituting the signal change-over circuit.

The ECL circuit $10_1$ constitutes a signal source which generates a logical signal $S_1$ of a high-speed pulse, and the emitter of its output transistor 10A is connected in series to the transmission line $12_1$ of a characteristic impedance $Z_0$ (50 $\Omega$, for instance). High-level and low-level voltages $V_H$ and $V_L$ of the logical signal $S_1$ which is generated by the ECL circuit $10_1$ are, for example, $-0.8$ and $-1.7$ V, respectively, and the corresponding emitter currents $I_{EH}$ and $I_{EL}$ of the output transistor 10A are, for instance, 23 and 6 mA, respectively. The output end of the transmission line $12_1$ is connected to the anode of a switching diode 21 of the gate circuit $20_1$. The gate circuit $20_1$ comprises: a pair of series-connected switching diodes 21 and 22 which have their cathodes interconnected and the former of which has its anode connected to the transmission line $12_1$; a parallel switching diode 23 which is connected between the common connection point A of the series-connected switching diodes 21 and 22 and the common potential point, in a direction in which the anode of the diode 23 is connected to the common connection point A; a bias supply circuit 24 by which the series-connected switching diodes 21 and 22 are reversely biased (turned OFF) and the parallel switching diode 23 is forwardly biased (turned ON); a current pull-in control circuit 27 which pulls in current from the series-connected switching diodes 21 and 22 and turns them ON and the parallel switching diode 23 OFF; an impedance matching resistor 14 connected to the anode side of the switching diode 22; and a power supply $V_T$ which, when in the ON state, supplies an ON current via the matching resistor 14 to the switching diode 22 and, when in the OFF state, holds an output side transmission line 13 at a fixed potential. The diodes 21, 22 and 23 are high-frequency diodes of small junction capacitance.

The current pull-in control circuit 27 is a made up of, for example, a switching element 25 and a constant-current source 26. For example, when the control signal $C_1$ is high-level, the switching element 25 connects therethrough the constant-current source 26 to the common connection point A side of the diodes 21 and 22, and the constant-current source 26 pulls in a constant current Ic, for example, 30 mA from the common connection point A, and hence pulls in the current through the series-connected switching diodes 21 and 22 and turns them ON. On the other hand, the parallel switching diode 23 is turned OFF, because no current can be pulled in therefrom. As a result of this, the gate circuit $20_1$ conducts and the output signal $S_1$ from the ECL circuit $10_1$ is provided via the series-connected switching diodes 21 and 22 to the transmission line 13 at the output side of the gate circuit $20_1$ and is then supplied to the OR circuit 30 which forms coupling means. The ON-state current of the switching diode 21 is the emitter current from the output transistor 10A of the ECL circuit $10_1$, and the ON-state current of the switching diode 22 is supplied from the $-0.5$-volt power supply $V_T$ via the 50-ohm matching resistor 14. Since the constant-current source 26 pulls in the 30-mA current in this example, the ON-state current of the switching diode 22 is $I_{OH}=6$ mA and $I_{OL}=24$ mA when the logical signal $S_1$ is high- and low-level, respectively. The ON state of the switching diodes 21 and 22 is equivalent to the connection of the emitter of the output transistor 10A of the ECL circuit $10_1$ to a $-2$-volt normal termination voltage $V_{TT}$ via the 50-ohm resistor, and circuit constants are designed so that they bear the following relationships:

$$V_T = V_H + V_L - V_{TT}$$

$$I_C = I_{EH} + I_{EL} = I_{EH} + I_{OH} = I_{EL} + I_{OL}.$$

Conversely, when the control signal $C_1$ to the switching element 25 is low-level, the constant-current source 26 is grounded, and by the bias supply circuit 24, the series-connected switching diodes 21 and 22 are reversely biased and the parallel switching diode 23 is forwardly biased. The power source $+V$ and the resistance of the bias supply circuit 24 are 15 volts and 15 kilohms, for example. Consequently, the series-connected switching diodes 21 and 22 are turned OFF to disable the gate circuit $20_1$ and the parallel switching diode 23 is turned ON. In this instance, since no current flows through the series switching diodes 21 and 22 when they are OFF, no emitter current flows in the output transistor 10A of the ECL circuit $10_1$ connected to them via the transmission line $12_1$. That is, the logical signal $S_1$ is not provided on the transmission line $12_1$ from the output transistor 10A. Even if a low-level signal corresponding to the signal $S_1$ is provided on the transmission line $12_1$ due to a leakage in the output transistor 10A, it cannot pass through the gate circuit $20_1$ because the series switching diodes 21 and 22 are in the OFF state.

In this way, the gate circuit $20_1$ connects and disconnects the signal transmission lines $12_1$ and 13 in accordance with the ON/OFF state of the switching element 25. In practice, the operation of the constant-current source 26 is placed directly under ON/OFF control of the control signal $C_1$, that is, the switching element 25 is not used, and the constant-current source 26 is connected directly to the common connection point A. The voltage source $V_T$ connected to the matching resistor 14 of the gate circuit $20_1$ is not always needed but instead the end of the impedance matching resistor 14 may be connected to the common potential point.

In this embodiment, since the switching diodes 21 and 22 are connected in series between the signal transmission lines $12_1$ and 13, the overall junction capacitance of the diodes 21 and 22 in their OFF state is one-half that in the case of one diode being connected between the transmission lines $12_1$ and 13, and consequently the leakage of signal can be reduced.

Besides, since the switching diode 23 is turned ON to permit conduction between the signal transmission lines $12_1$ and 13 and the common potential point, a signal which tends to leak through the junction capacitance formed by the series-connected switching diodes 21 and 22 is by-passed via the switching diode 23. Thus, even if a signal is provided on the transmission line $12_1$ due to leakage or interference when the gate circuit $20_1$ is OFF, the leakage of signal to the output side of the gate circuit $20_1$ is very small.

In a signal change-over circuit (or multiplexer), a plurality of such signal switching circuits are provided and their outputs are connected to the OR circuit 30 as shown in FIG. 2, since the series-connected switching diodes 21 and 22 of the gate circuits in unselected signal switching circuits are turned OFF, their ECL circuits do not output logical signals. Accordingly, there is no signal interference from the transmission lines of the unselected signal switching circuits to the transmission line of the selected signal switching circuit. For example, when the signal switching circuit $100_1$ is selected, even if the signal $S_1$ provided on the transmission line $12_1$ applies an interference signal to the transmission line of an unselected signal switching circuit, for example, the adjacent transmission line $12_2$ of the signal switching circuit $100_2$, the signal leakage level from its gate circuit $20_2$ to the output side thereof is negligibly small.

Figure 3:
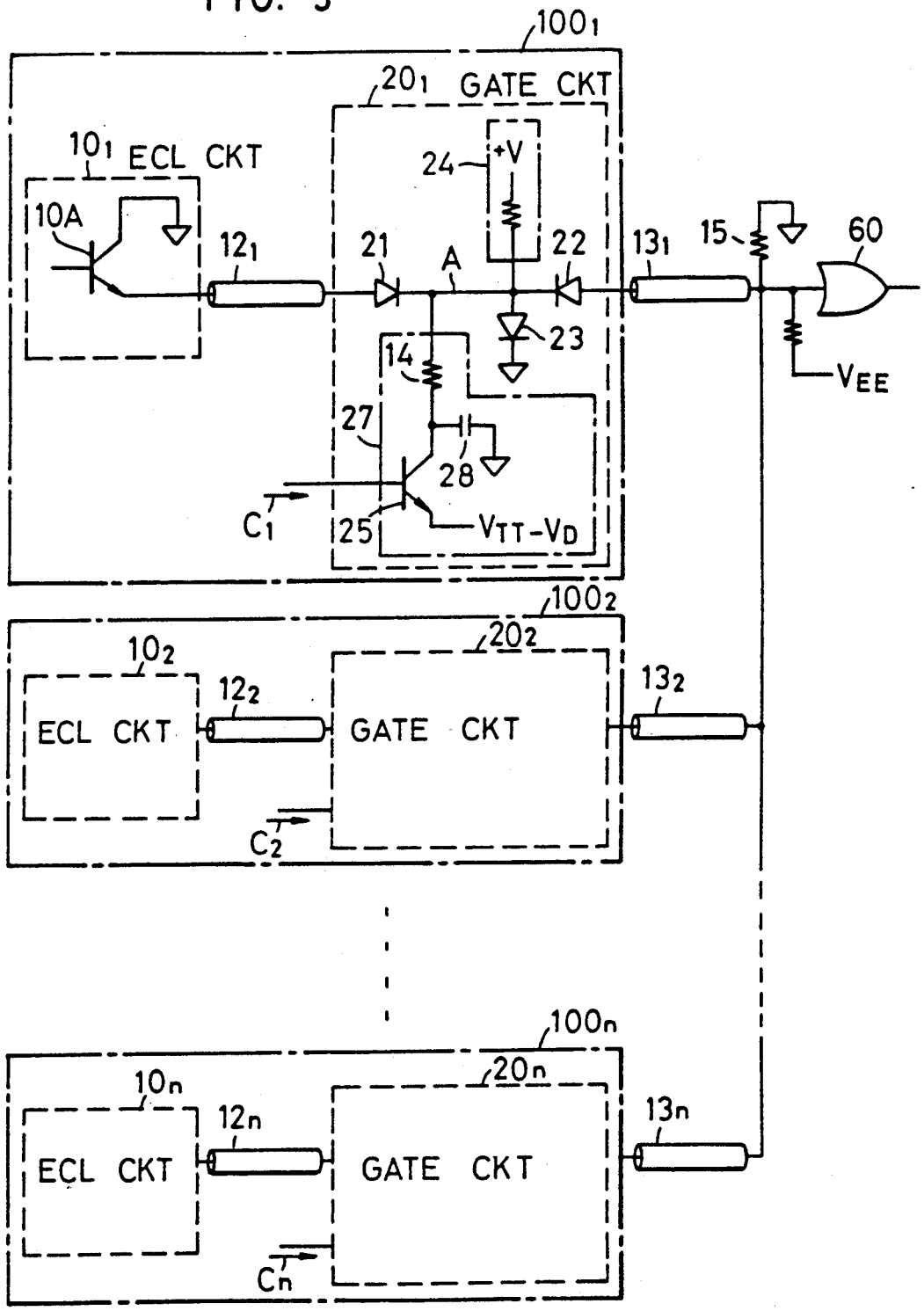
FIG. 3 is a block diagram of a signal change-over circuit formed using signal switching circuits produced according to another embodiment of the present invention.

FIG. 3 illustrates another embodiment of the signal switching circuit of the present invention, which is also shown to be used in the signal change-over circuit. In this embodiment the current pull-in control circuit 27 of the gate circuit $20_1$ does not employ the constant-current source but instead it is arranged to pull in current from the common connection point A to a power source ($V_{TT}-V_D$) via a series connection of the impedance matching resistor 14 and a transistor switching element 25. $V_D$ is the junction voltage of the switching diodes 21 and 22 and is about 0.8 volts, for example. The connection point of the matching resistor 14 and the switching element 25 is grounded via a capacitance 28 in AC-wise. This pull-in current is liable to vary with variations in electrical properties of parts forming the entire circuit and their temperature dependence, and differs with the high and low levels of the logical signal $S_1$ on the transmission line $12_1$, and hence the level of the output logical signal is not very accurate, but this circuit structure is low-cost since no constant-current source is employed. In this embodiment output lines $13_1$ through $13_n$ of the signal switching circuits $100_1$ through $100_n$ of the same construction are coupled by a wired OR and a logical signal is provided via a buffer gate 60. A resistor 15 for supplying an ON-state current to the diodes 22 of the gate circuits $20_1$ through $20_n$ is provided in common thereto and its resistance value is selected sufficiently higher than that of the matching resistor 14, for example, about 10 times high than the latter. The signal switching circuit $100_1$ is identical in construction with that shown in FIG. 2, except the above.

Figure 4:
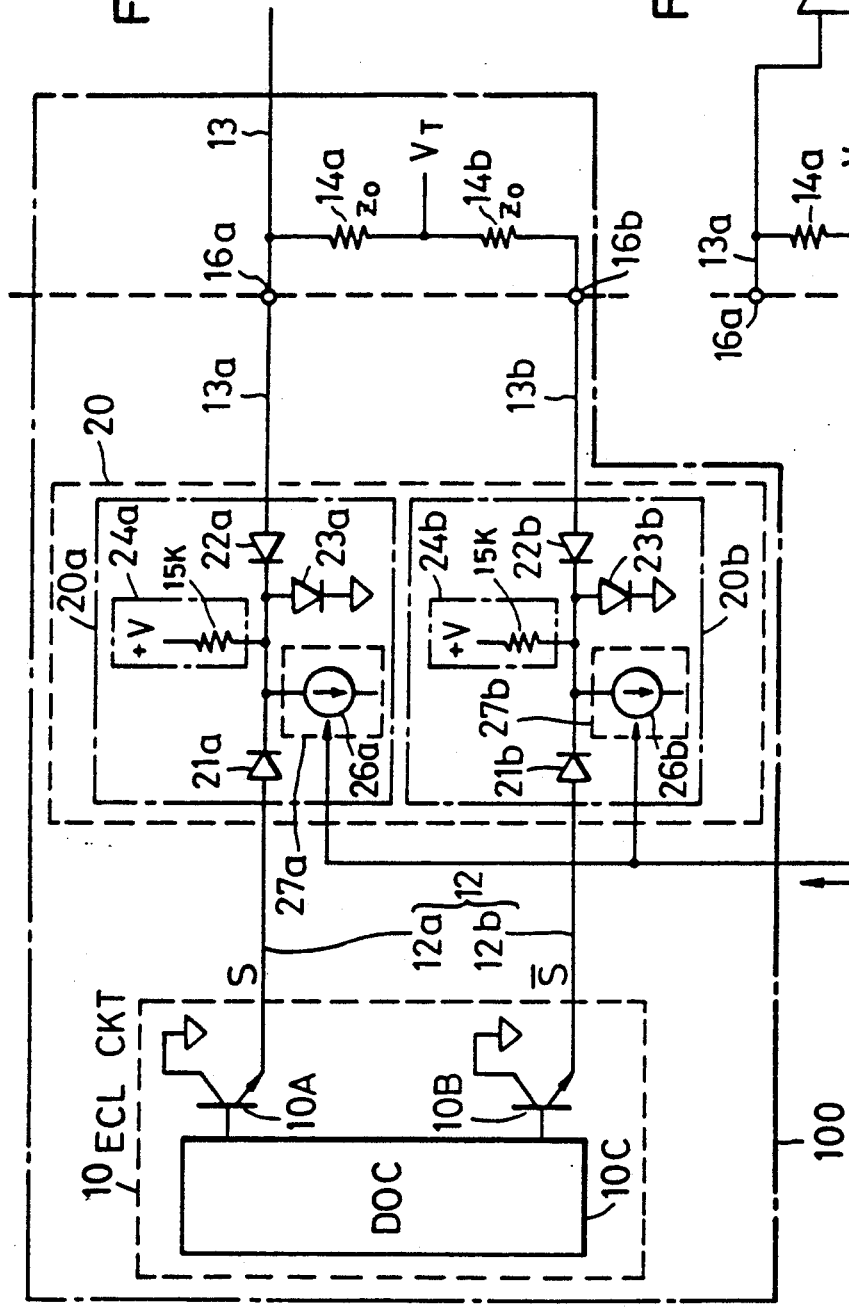
FIG. 4 is a circuit diagram of another embodiment of the signal switching circuit of the present invention.
Figure 5:
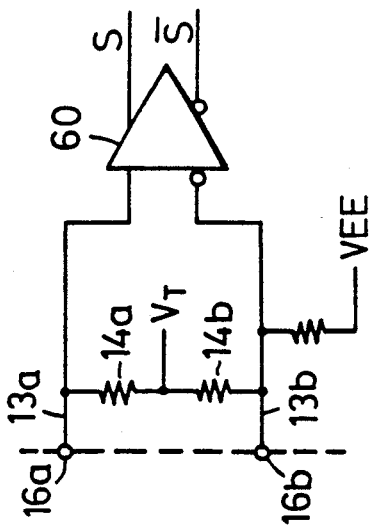
FIG. 5 is a circuit diagram of a modified form of the output side of the signal switching circuit shown in FIG. 4.

FIG. 4 illustrates another embodiment of the signal switching circuit of the present invention, in which the signal switching circuit $100_1$ depicted in FIG. 2 is formed as a differential signal switching circuit. In this embodiment the ECL circuit 10 outputs a logical signal S and an inverted logical signal $\bar{S}$ from a differential output circuit 10C via output transistors 10A and 10B, respectively, and these logical signals S and $\bar{S}$ are input into gate circuits 20a and 20b via lines 12a and 12b, respectively. The outputs of the gate circuits 20a and 20b are connected to a power source $V_T$ via matching resistors 14a and 14b of a characteristic impedance $Z_0$, and in this example, the output of the gate circuit 20a is provided. The gate circuits 20a and 20b are each identical in construction and in operation with the gate circuit $20_1$ depicted in FIG. 2. The operations of constant-current sources 26a and 26b of current pull-in control circuits 27a and 27b are turned ON and OFF by the same control signal C. The transmission lines 12a and 12b constitute a so-called twisted pair line 12 of a characteristic impedance $Z_0$, and lines 13a and 13b also form a twisted pair line 13. By transmitting the differential logical signals S and $\bar{S}$ over the twisted pair lines 12 and 13, noise which is generated by current variations in the both transmission lines is cancelled between them. Where it is desired to provide both of the differential signals S and $\bar{S}$ to the stage following the signal switching circuit shown in FIG. 4, the output side of circuit points 16a and 16b need only to be constructed as depicted in FIG. 5. That is, the output ends of the transmission lines 13a and 13b are connected to the power source $V_T$ via the matching resistors 14a and 14b, respectively, and at the same time, they are connected to a differential buffer amplifier 60 so that the logical signals S and $\bar{S}$ are provided at its non-inverting output and inverting output, respectively. A signal change-over circuit can be formed by providing a plurality of signal switching circuits 100 shown in FIG. 4 and by applying their outputs to the OR circuit 30 as depicted in FIG. 2. It is also possible to provide a plurality of structures from the ECL circuit 10 to the circuit points 16a and 16b shown in FIG. 4 and to couple the corresponding circuit points 16a and 16b by a wired OR circuit as shown in FIG. 3.

Figure 6:
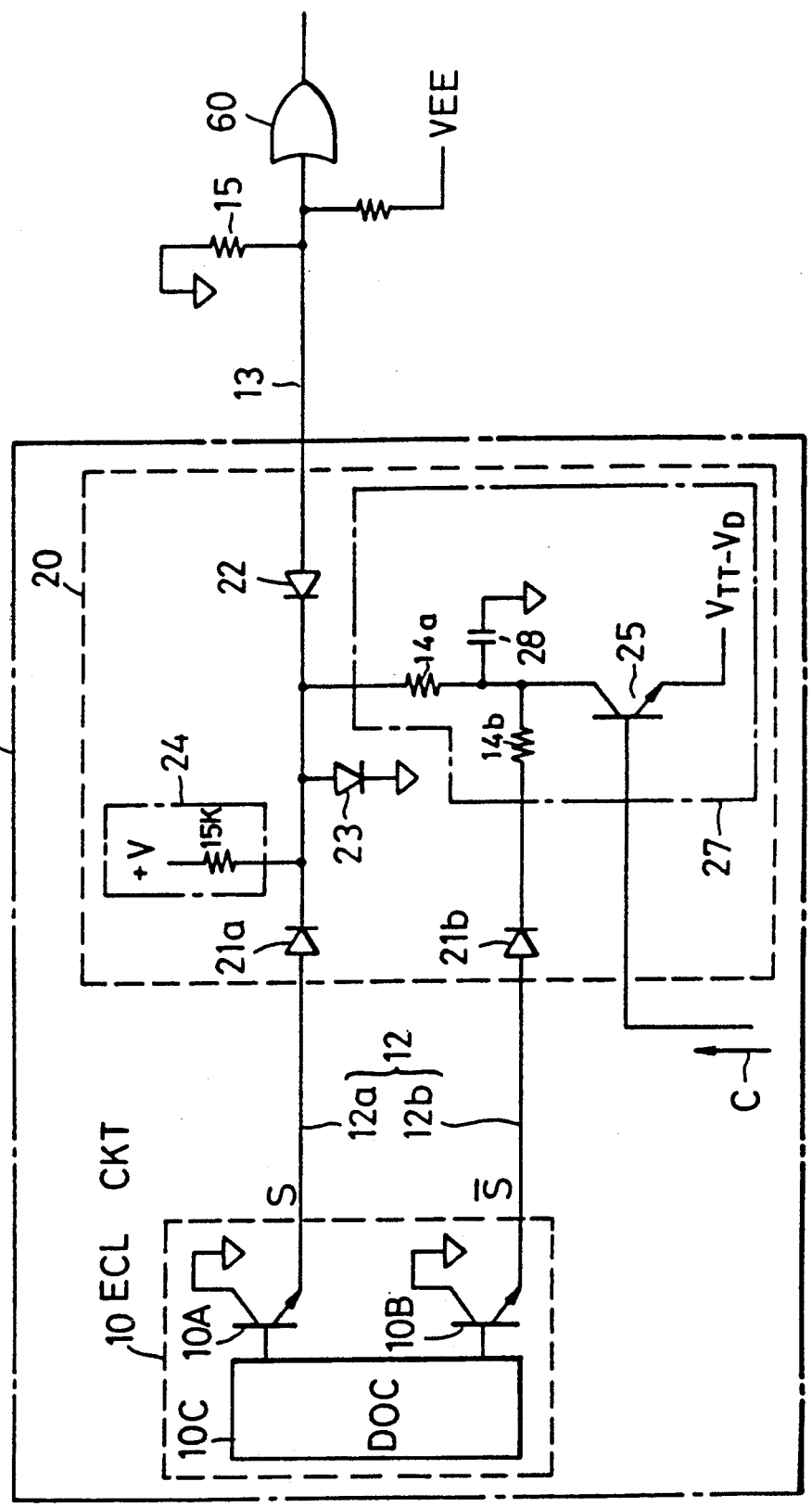
FIG. 6 is a circuit diagram of another embodiment of the signal switching circuit of the present invention.

FIG. 6 illustrates another embodiment of the signal switching circuit of the present invention, in which the signal switching circuit $100_1$ depicted in FIG. 3 is formed as a differential signal switching circuit. Also in this embodiment the ECL circuit 10 outputs the logical signals S and $\bar{S}$ from the differential output circuit 10C via the output transistors 10A and 10B, and the signals S and $\bar{S}$ are applied via the twisted pair line 12 to the gate circuit 20 as is the case with the embodiment shown in FIG. 4. The gate circuit 20 has the same structure as that of the gate circuit $20_1$ depicted in FIG. 3 but includes a series connection of another switching diode 21b and another matching resistor 14b. The anode of the switching diode 21b is connected to the output end of the transmission line 12b and the matching resistor 14b is connected to the junction of the switching element 25 and the matching resistor 14a. With such an arrangement, when the switching element 25 is turned ON by the control signal C, current is pulled in toward the power source $V_{TT}-V_D$ via the switching diodes 21a, 21b and 22, turning them ON but OFF the diode 23. Conversely, when the switching element 25 is turned OFF by the control signal C, the diode 23 is turned ON by the bias current supply circuit 24, whereas the diodes 21a, 21b and 22 are turned OFF. A signal change-over circuit can be formed by a plurality of signal switching circuits 100 shown in FIG. 6 and by coupling their outputs with a wired OR circuit as depicted in FIG. 3.

Figure 7:
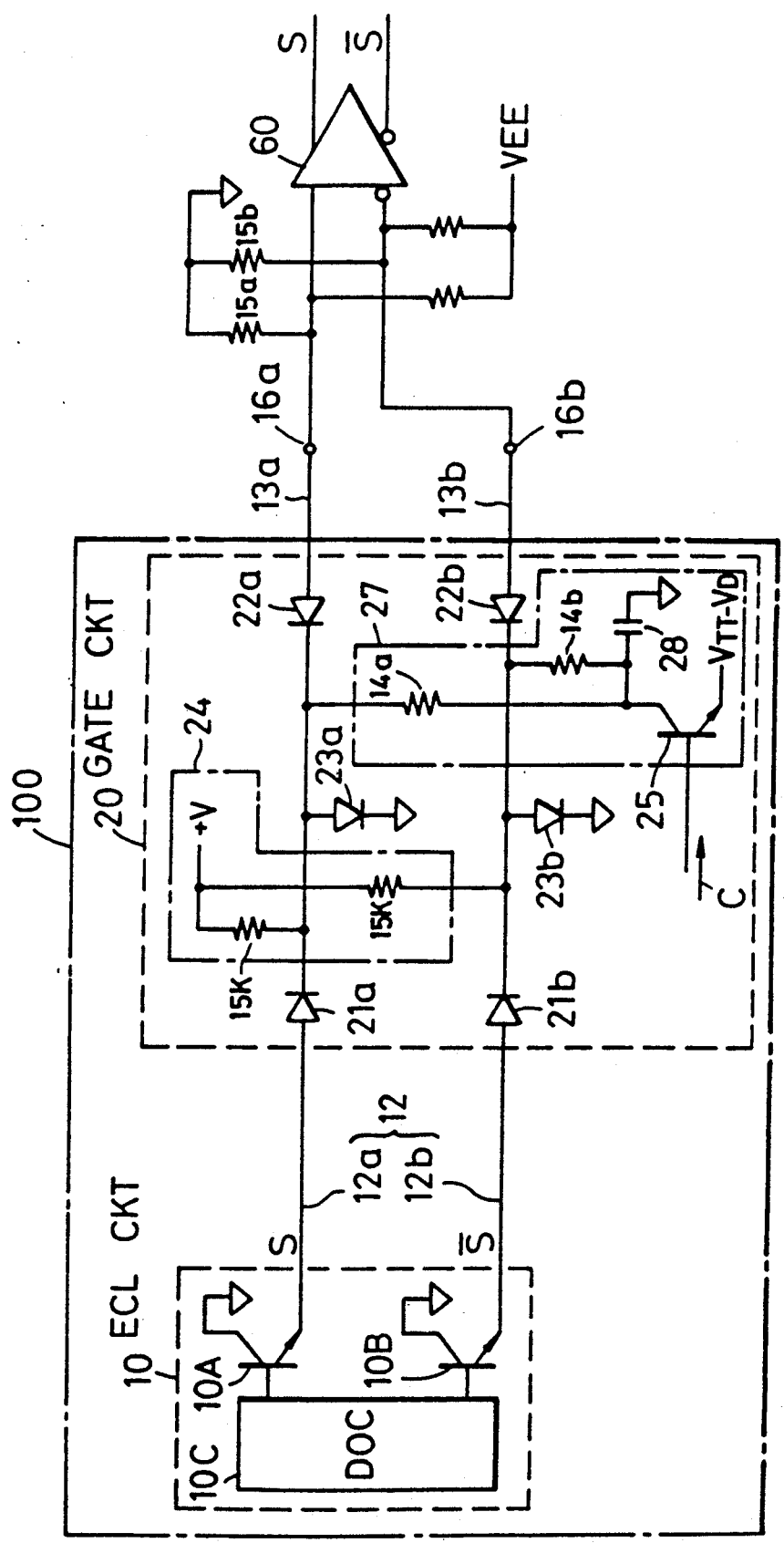
FIG. 7 is a circuit diagram of another embodiment of the signal switching circuit according to the invention.

FIG. 7 illustrates a modified form of the embodiment of FIG. 6, in which the differential logical signals S and $\bar{S}$ are applied to the next-stage circuit. In this embodiment the gate circuit 20 has an arrangement in which the switching diodes 21a, 22a and 23a and the matching resistor 14a are provided in association with the transmission line 12a and the switching diodes 21b, 22b and 23b and the matching resistor 14b are provided in association with the transmission line 12b. The output of the gate circuit 20 is provided via the transmission lines 13a and 13b to the differential buffer amplifier 60, from which the logical signals S and $\bar{S}$ are delivered. A signal change-over circuit can be formed by a plurality of such signal switching circuits 100 and a wired OR circuit by which the corresponding circuit points 16a and 16b are coupled.

Figure 8:
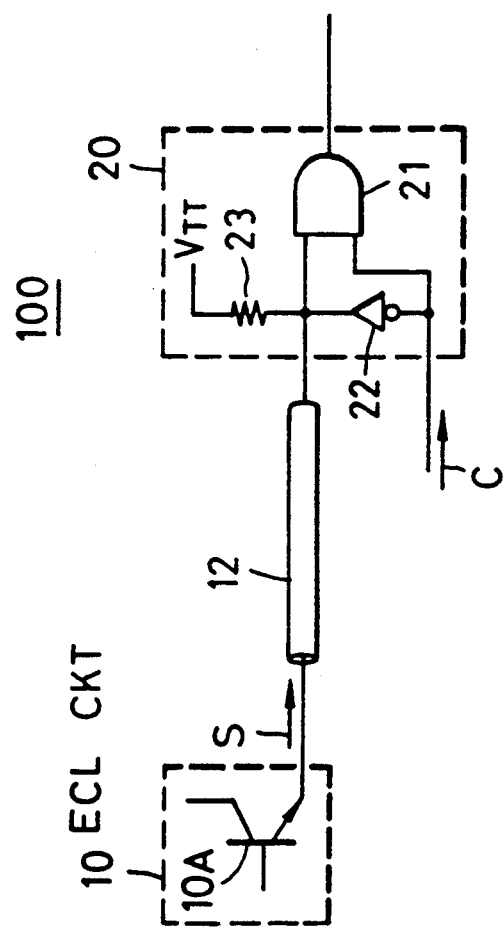
FIG. 8 is a circuit diagram of still another embodiment of the signal switching circuit.

FIG. 8 illustrates still another embodiment of the signal switching circuit 100 of the present invention. The ECL circuit 10 yields a desired logical signal S via the emitter of the output transistor 10A. The logical signal S is provided to one end of the transmission line 12 of a characteristic impedance $Z_0$. The other end of the transmission line is connected to the one input of an AND gate 21 in the gate circuit 20, and the control signal C is applied to the other input of the AND gate 21 for controlling its ON/OFF operation. The control signal C is also applied to an inverter 22 formed by, for example, an ECL circuit. The output of the inverter 22 is connected to the output end of the transmission line 12, forming a wired OR circuit. The one input of the AND gate 21 is further connected via a matching resistor 23 of a characteristic impedance $Z_0$ to a termination voltage source $V_{TT}$.

When the control signal C is high-level, the AND gate 21 is enabled. At this time, the inverter 22 yields a low-level output, which is ORed with the logical signal S from the transmission line 12, and as a result, the logical signal S is applied intact to the one input of the AND gate 21 and is output therethrough. When the control signal C is low-level, the AND gate 21 is disabled. At this time, the inverter 22 provides a high-level output, which is ORed with the logical signal S from the transmission line 12, and as a result, the one input of the AND gate 21 is held high regardless of the logical signal S. Since the AND gate 21 is being disabled, the high-level output does not pass through the gate 21. Since the output end of the transmission line 12 and the output side of the inverter 22 are coupled in a wired OR form, the transmission line 12 is also held high by the high-level output of the inverter 22.

As described above, when the signal switching circuit is in the logical state in which the control signal C disables the gate 21, the inverter 22 produces the high-level output to hold high-level the input side of the gate 21 connected to the transmission line 12 regardless of the logical signal S, inhibiting the application of the logical signal S to the input of the gate 21. Thus, even if the frequency of the logical signal S rises, there is no possibility of leakage of the logical signal S to the output side of the gate 21.

Figure 9:
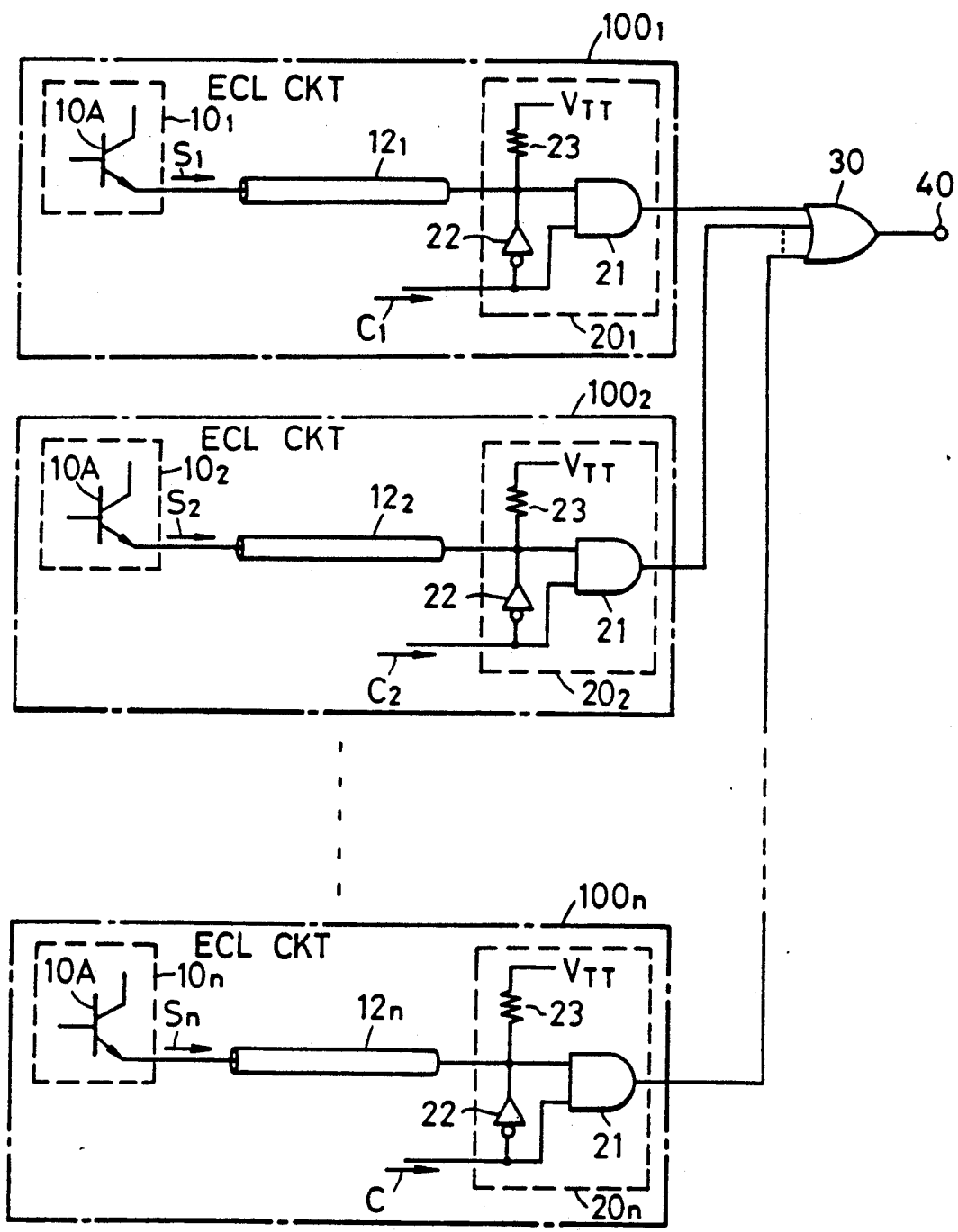
FIG. 9 is a circuit diagram of a signal change-over circuit using a plurality of signal switching circuits depicted in FIG. 8.

FIG. 9 illustrates an example in which a signal change-over circuit is formed by a plurality of signal switching circuits of the same construction as the circuit shown in FIG. 8. That is, n signal switching circuits 100 are provided and the outputs of AND gates $21_1$ to $21_n$ of their gate circuits $20_1$ to $20_n$ are connected to an OR circuit 30. The OR circuit 30 is provided for supplying the outputs of the gate circuits $20_1$ to $20_n$ and it may also be a simple wired OR circuit. Each signal switching circuit is exactly identical in construction with the circuit shown in FIG. 8, hence is exactly identical in operation, too.

When a desired one of control signals $C_1$ to $C_n$ for the gates circuits $20_1$ to $21_n$, for example, $C_1$ is made high-level, the AND gate 21 supplied with the control signal $C_1$ is enabled to permit the passage therethrough of the corresponding logical signal $S_1$. Since the other control signals $C_2$ to $C_n$ are held low-level, the AND gates 21 of the gate circuits $20_2$ to $20_n$ remain disabled, and consequently, the logical signals $S_2$ to $S_n$ do not leak to the outputs of the gate circuits $20_2$ to $20_n$ as described above with respect to FIG. 8. Thus, only the selected logical signal $S_1$ is provided as the output of the signal change-over circuit to the output terminal 40 via the OR circuit 30. In addition, the transmission lines $12_2$ to $12_n$ associated with the AND gates 21 which are supplied with the low-level control signals $C_2$ to $C_n$ are all held high-level as described previously, and the logical signals $S_2$ to $S_n$ are not essentially present on the transmission lines $12_2$ to $12_n$. Accordingly, there is no possibility of interference of the unselected logical signals $S_2$ through $S_n$ to the selected logical signal $S_1$ between the transmission lines $12_1$ to $12_n$.

As described above, according to the signal switching circuit of the present invention, since the closing of the gate circuit 20 by the control signal C prevents the application of the logical signal S from the ECL circuit 10 to the transmission line 12, the logical signal S will not leak to the output side of the gate circuit 20. Moreover, in the case where a signal change-over circuit is formed by a plurality of such signal switching circuits, no interference of logical signals will occur between transmission lines 12.

It will be apparent that many modifications and variations may be effected without departing from the scope of the novel concepts of the present invention.

What is claimed is:

1. A signal switching circuit comprising:
   an emitter-coupled logical circuit having an output transistor which outputs a logical signal from its emitter;
   a transmission line having an input end connected in series to the emitter of said output transistor of said emitter-coupled logical circuit and having an output end;
   switching diode means connected in series to the output end of said transmission line; and
   bias control means responsive to a control signal to effect ON/OFF control of said switching diode means,
   said switching diode means, when in the ON state, permitting the passage therethrough of the logical signal for output and, when in the OFF state, operating to prevent the logical signal from being provided on said transmission line from the emitter of said output transistor of said emitter-coupled logical circuit;
   said switching diode means including:
   a pair of series-connected switching diodes which have their cathodes interconnected, one of which has its anode connected to the output end of said transmission line and the other which has its anode disposed at an output side of said signal switching circuit;
   a parallel switching diode having its anode connected to a common connection point of said pair of series-connected switching diodes and having its cathode connected to a common potential point;

said bias control means including:

current pull-in means responsive to the control signal to pull-in current via said series-connected switching diodes to turn them ON; and bias supply means connected to said common connection point of said pair of series-connected switching diodes, for applying a reverse bias to said pair of series-connected switching diodes and a forward bias to said parallel switching diode when said current pull-in means does not pull in current.

2. The signal switching circuit of claim 1, wherein said current pull-in means includes:

constant-current source means connected to said common connection point of said pair of series-connected switching diodes, for pulling in a constant current from said pair of series-connected switching diodes in response to the control signal, and a matching resistor connected to the output side of said pair of series-connected switching diodes.

3. The signal switching circuit of claim 1, wherein said current pull-in means includes:

a current pull-in power source;

a matching resistor connected at one end to said common connection point of said pair of series-connected switching diodes; and a switching element connected in series between the other end of said matching resistor and said current pull-in power source.

4. A signal switching circuit comprising:

an emitter-coupled logical circuit having first and second output transistors which provide from their emitters first and second logical signals having logic levels which are reversed;

first and second transmission lines having input ends connected in series to the emitters of said first and second output transistors and having output ends, for transmitting said first and second logical signals, respectively;

first and second switching diodes having anodes connected to the output ends of said first and second transmission lines, respectively;

a third switching diode having a cathode connected to the cathode of said first switching diode;

current pull-in means connected to the cathodes of said first, second and third switching diodes and responsive to a control signal to pull in current from said first, second and third switching diodes to turn them ON; and bias supply means for applying a reverse bias to said first, second and third switching diodes to hold then OFF when said current pull-in means is OFF;

wherein when said current pull-in means is ON, said first and second switching diodes permit the passage therethrough of said first and second logical signals for output and, when said current pull-in means is OFF, said first and second switching diodes operate to prevent said first and second logical signals from being provided on said first and second transmission lines from said emitters of said first and second output transistors.

5. The signal switching circuit of claim 4, further including:

a fourth switching diode having a cathode connected to the cathode of said second switching diode;

first and second matching resistors connected at one end to the anode of said third and fourth switching diodes;

current supply means connected to the other ends of said first and second matching resistors, for supplying an ON-state current to said third and fourth switching diodes; and fifth and sixth switching diodes having anodes connected to the cathodes of said first and second switching diodes, respectively, and having cathodes connected to a common potential point, wherein said current pull-in means includes first and second constant-current source means connected to the cathodes of said first and second switching diodes, respectively, and placed under ON/OFF control in response to the control signal to perform the current pull-in operation.

6. The signal switching circuit of claim 5, further including a differential buffer amplifier having its non-inverting and inverting inputs connected to the anodes of said third and fourth switching diodes and provided with non-inverting and inverting outputs.

7. The signal switching circuit of claim 5, wherein said first and second transmission lines form a twisted pair line having a characteristic impedance.

8. The signal switching circuit of claim 4, wherein said current pull-in means includes:

first and second matching resistors connected at one end to the cathodes of said first and second switching diodes and connected at the other ends to each other;

a current pull-in source;

a switching element connected in series between the other ends of said first and second matching resistors and said current pull-in source and placed under ON/OFF control in response to the control signal;

an AC grounding capacitance connected between the other ends of said first and second matching resistors and said common potential point; and first On-state current control means connected to the anode of said third switching diode, for supplying an ON-state current which flows through said third switching diode when it is in the ON state.

9. The signal switching circuit of claim 8, further including:

a fourth switching diode having a cathode connected to the cathode of said second switching diode and turned ON by a current pull-in by said current pull-in means;

second ON-state current supply means connected to the anode of said fourth switching diode, for supplying an ON-state current which flows through said fourth switching diode when it is in the ON-state; and fifth and sixth switching diodes having anodes connected to the cathodes of said first and second switching diodes, respectively, and having cathodes connected to said common potential point, wherein said bias supply means is connected to the cathodes of said first and second switching diodes and applies a reverse bias to said first second, third and fourth switching diodes, and a forward bias to said fifth and sixth switching diodes when said current pull-in means is in the OFF state.

10. The signal switching circuit of claim 9, further including a differential buffer amplifier having its non-inverting and inverting inputs connected to the anodes of said third and fourth switching diodes and provided with non-inverting and inverting outputs.

11. The signal switching circuit of claim 8, wherein said first and second transmission lines for a twisted pair line having a characteristic impedance.

12. The signal switching circuit of claim 4, wherein said first and second transmission lines form a twisted pair line having a characteristic impedance.

13. A signal switching circuit comprising:
an emitter-coupled logical circuit having an output transistor having an emitter which outputs a logical signal;
a transmission line having an input end connected to the emitter of said output transistor of said emitter-coupled logical circuit and having an output end, for transmitting said logical signal;
gate means supplied with said logical signal at a first input terminal connected to the output end of said transmission line and supplied at a second input terminal with a control signal for enabling and disabling said gate means; and
level holding means supplied with said control signal and having an output connected to said first input terminal of said gate means, so that when said control signal is in a logical state of disabling said gate means, a high-level output is provided to hold said first input terminal of said gate means high-level regardless of said logical signal.

14. A signal change-over circuit comprising:
a plurality of emitter-coupled logical circuits, each having a pair of output transistors which output from their emitters a pair of logical signals having logic levels which are reversed;
a plurality of pairs of transmission lines each having an input end connected in series to the emitters of said pair of output transistors of the corresponding one of said emitter-coupled logical circuits and each having an output end, for transmitting said pair of logical signals;
a plurality of gate circuits each connected to the output ends of the corresponding one of said pairs of transmission lines, for permitting or inhibiting the passage therethrough of at least one of said pair of logical signals in response to a corresponding control signal; and
coupling means for coupling together the outputs of said gate circuits and for outputting at least one of said logical signals which has passed through a selected one of said gate circuits,
wherein said gate circuits each include:
first and second switching diodes having anodes connected to the output ends of the corresponding one of said pairs of transmission lines;
a third switching diode having its cathode connected to the cathode of said first switching diode;
current pull-in means connected to the cathodes of said first, second and third switching diodes and responsive to the corresponding one of said control signals to pull in current from said first, second and third switching diodes to turn them ON; and
bias supply means whereby when said current pull-in means is in the OFF state, a reverse bias is applied to the cathodes of said first, second and third switching means to hold them in the OFF state.

15. A signal change-over circuit comprising:
a plurality of emitter-coupled logical circuits, each having a output transistor which outputs a logical signal from its emitter;
a plurality of transmission lines each having an input end connected to the emitter of said output transistor of the corresponding one of said emitter-coupled logical circuits and having an output end;
a plurality of gate means each supplied with said logical signal at a first input terminal connected to the output end of the corresponding one of said transmission lines and supplied at a second input terminal with a corresponding control signal for enabling and disabling said gate means;
a plurality of level holding means each supplied with a corresponding one of said control signals and connected to said first input terminal of the corresponding one of said gate means, so that when said control signal is in a logical state of disabling said gate means, a high-level output is provided to thereby hold said first input terminal of said gate means high-level regardless of said logical signal;
coupling means for coupling together the outputs of said plural gate means,
wherein one of said gate means is enabled by a selected one of said control signals to permit the passage therethrough of the corresponding one of said logical signals for output via said coupling means.

* * * * *

UNITED STATES PATENT AND TRADEMARK OFFICE
CERTIFICATE OF CORRECTION

PATENT NO. : 5,087,833
DATED : FEBRUARY 11, 1992
INVENTOR(S) : MASAO SUGAI

It is certified that error appears in the above-identified patent and that said Letters Patent is hereby corrected as shown below:

TITLE PAGE [22] "Apr. 9, 1999" should be --Apr. 9, 1990--;

[56] line 4, "3,617,771   1/1971   Lee....."
should be
--3,617,771   11/1971   Lee.....--.

Col. 10, line 41, "On-state" should be --ON-state--.

Col. 11, line 4, "for" should be --form--.

Signed and Sealed this

Twenty-first Day of September, 1993

Attest:

BRUCE LEHMAN

Attesting Officer

Commissioner of Patents and Trademarks